United States Patent
Kuribayashi

(10) Patent No.: US 7,202,745 B2
(45) Date of Patent: Apr. 10, 2007

(54) POWER AMPLIFIER CIRCUIT

(75) Inventor: Yasuji Kuribayashi, Isesaki (JP)

(73) Assignee: Victor Company of Japan, Ltd., Yokohama (JP)

( * ) Notice: Subject to any disclaimer, the term of this patent is extended or adjusted under 35 U.S.C. 154(b) by 575 days.

(21) Appl. No.: 10/824,590

(22) Filed: Apr. 15, 2004

(65) Prior Publication Data
US 2004/0227571 A1 Nov. 18, 2004

(30) Foreign Application Priority Data
May 12, 2003 (JP) ............................. 2003-133216

(51) Int. Cl.
H03F 3/217 (2006.01)
(52) U.S. Cl. ...................................... 330/297; 330/251
(58) Field of Classification Search ................ 330/136, 330/207 A, 251, 297
See application file for complete search history.

(56) References Cited

U.S. PATENT DOCUMENTS 4,329,657 A * 5/1982 Kamiya ....................... 330/297
4,339,730 A * 7/1982 Yokoyama .................. 330/297
4,423,389 A * 12/1983 Fushiki ....................... 330/297

OTHER PUBLICATIONS

"Audio Power Amplifier IC with Shift Power Supply", STK412-400 Series, SANYO Electric Co. Ltd. Semiconductor Company (as of Jun. 2002).

* cited by examiner

Primary Examiner—Steven J. Mottola
(74) Attorney, Agent, or Firm—Louis Woo

(57) ABSTRACT

A switching device operates for selectively connecting either a low-voltage power supply or a high-voltage power supply to a power amplifier. A signal voltage is generated in response to a voltage outputted from the power amplifier. A reference-voltage generation circuit operates for generating a positive-circuit-side reference voltage and a negative-circuit-side reference voltage. A control circuit operates for comparing the signal voltage with the reference voltages and controlling the switching device in response to the results of the comparison. The reference-voltage generation circuit includes a first voltage regulating circuit connected between a positive side of the low-voltage power supply and a first circuit point subjected to a negative potential for generating the positive-circuit-side reference voltage, and a second voltage regulating circuit connected between a negative side of the low-voltage power supply and a second circuit point subjected to a positive potential for generating the negative-circuit-side reference voltage.

8 Claims, 8 Drawing Sheets

POWER AMPLIFIER CIRCUIT

BACKGROUND OF THE INVENTION

1. Field of the Invention

This invention relates to a power amplifier circuit for use in, for example, audio apparatuses or audio visual (AV) apparatuses.

2. Description of the Prior Art

Audio apparatuses and audio visual (AV) apparatuses include power amplifiers. There is a power amplifier circuit having a power amplifier and a known system for reducing a power loss and suppressing the generation of heat in the power amplifier.

The known system in the power amplifier circuit includes a high-voltage power supply and a low-voltage power supply. The known system selects one from the high-voltage power supply and the low-voltage power supply in response to the voltage of an output signal from the power amplifier. The known system uses the selected power supply to feed electric power to the power amplifier. When the voltage of the output signal from the power amplifier exceeds a threshold, the high-voltage power supply is used. Otherwise, the low-voltage power supply is used. Thus, the known system implements switching between the high-voltage power supply and the low-voltage power supply in response to the voltage of the output signal from the power amplifier.

In the case where the output signal from the power amplifier has a small amplitude so that the low-voltage power supply is used, the generation of heat is more effectively suppressed as the voltage of the low-voltage power supply is decreased. In the known system, the switching between the high-voltage power supply and the low-voltage power supply tends to be wrong when the voltage of the low-voltage power supply is set to a relatively small level.

The voltage of the output signal from the power amplifier varies in accordance with the impedance of a loudspeaker connected thereto. Thus, conditions of the comparison between the output signal voltage and the threshold depend on the impedance of a loudspeaker connected to the power amplifier. In the known system, the switching between the high-voltage power supply and the low-voltage power supply tends to be wrong when a loudspeaker having a relatively low impedance is connected to the power amplifier.

SUMMARY OF THE INVENTION

It is a first object of this invention to provide a power amplifier circuit which can properly implement switching between a high-voltage power supply and a low-voltage power supply even in the case where the voltage of the low-voltage power supply is set to a relatively small level.

It is a second object of this invention to provide a power amplifier circuit which can properly implement switching between a high-voltage power supply and a low-voltage power supply even in the case where a loudspeaker having a relatively low impedance is connected thereto.

A first aspect of this invention provides a power amplifier circuit comprising a power amplifier; a switching device for selectively connecting either a low-voltage power supply or a high-voltage power supply to the power amplifier; means for generating a signal voltage in response to a voltage outputted from the power amplifier; a reference-voltage generation circuit for generating a positive-circuit-side reference voltage and a negative-circuit-side reference voltage; and a control circuit for comparing the signal voltage with the positive-circuit-side and negative-circuit-side reference voltages and controlling the switching device in response to results of the comparison so that the low-voltage power supply is connected to the power amplifier when an absolute value of the signal voltage is smaller than absolute values of the positive-circuit-side and negative-circuit-side reference voltages, and that the high-voltage power supply is connected to the power amplifier when the absolute value of the signal voltage is greater than the absolute values of the positive-circuit-side and negative-circuit-side reference voltages; wherein the reference-voltage generation circuit comprises a first voltage regulating circuit connected between a positive side of the low-voltage power supply and a first circuit point subjected to a negative potential for generating the positive-circuit-side reference voltage, and a second voltage regulating circuit connected between a negative side of the low-voltage power supply and a second circuit point subjected to a positive potential for generating the negative-circuit-side reference voltage.

A second aspect of this invention is based on the first aspect thereof, and provides a power amplifier circuit wherein the negative potential is equal to a voltage at the negative side of the low-voltage power supply, and the positive potential is equal to a voltage at the positive side of the low-voltage power supply.

A third aspect of this invention is based on the first aspect thereof, and provides a power amplifier circuit wherein the negative potential is equal to a voltage at a negative side of the high-voltage power supply, and the positive potential is equal to a voltage at a positive side of the high-voltage power supply.

A fourth aspect of this invention is based on the first aspect thereof, and provides a power amplifier circuit wherein the negative potential is equal to a voltage at a negative side of a power source, and the positive potential is equal to a voltage at a positive side of the power source.

A fifth aspect of this invention provides a power amplifier circuit comprising a power amplifier; first means for generating a positive-circuit-side threshold voltage and a negative-circuit-side threshold voltage; second means for comparing a signal voltage outputted from the power amplifier with the positive-circuit-side and negative-circuit-side threshold voltages generated by the first means; and third means responsive to results of the comparing by the second means for enabling the power amplifier to be activated by a first power supply when the signal voltage is in a range between the positive-circuit-side and negative-circuit-side threshold voltages, and for enabling the power amplifier to be activated by a second power supply when the signal voltage is outside the range between the positive-circuit-side and negative-circuit-side threshold voltages; wherein a voltage across the first power supply is lower than a voltage across the second power supply; and wherein the first means comprises a first voltage regulating circuit connected between a first circuit point subjected to a first positive potential and a second circuit point subjected to a first negative potential for generating a positive-circuit-side regulated voltage, means for generating the positive-circuit-side threshold voltage from the positive-circuit-side regulated voltage, a second voltage regulating circuit connected between a third circuit point subjected to a second negative potential and a fourth circuit point subjected to a second positive potential for generating a negative-circuit-side regulated voltage, and means for generating the negative-circuit-side threshold voltage from the negative-circuit-side regulated voltage.

A sixth aspect of this invention is based on the fifth aspect thereof, and provides a power amplifier circuit wherein the first and second positive potentials are equal to a voltage at a positive side of the first power supply, and the first and second negative potentials are equal to a voltage at a negative side of the first power supply.

A seventh aspect of this invention is based on the fifth aspect thereof, and provides a power amplifier circuit wherein the first positive potential is equal to a voltage at a positive side of the first power supply, and the first negative potential is equal to a voltage at a negative side of the second power supply, and wherein the second positive potential is equal to a voltage at a positive side of the second power supply and the second negative potential is equal to a voltage at a negative side of the first power supply.

An eighth aspect of this invention is based on the fifth aspect thereof, and provides a power amplifier circuit wherein the first positive potential is equal to a voltage at a positive side of the first power supply, and the first negative potential is equal to a voltage at a negative side of a power source, and wherein the second positive potential is equal to a voltage at a positive side of the power source and the second negative potential is equal to a voltage at a negative side of the first power supply.

DETAILED DESCRIPTION OF THE INVENTION

A prior-art power amplifier circuit will be explained below for a better understanding of this invention.

The prior-art circuit includes a power amplifier, a high-voltage power supply, and a low-voltage power supply. The prior-art circuit selects one from the high-voltage power supply and the low-voltage power supply in response to the absolute value of the voltage of an output signal from the power amplifier. The prior-art circuit uses the selected power supply to feed electric power to the power amplifier. When the absolute value of the voltage of the output signal from the power amplifier exceeds a threshold, the high-voltage power supply is used. Otherwise, the low-voltage power supply is used.

Figure 1:
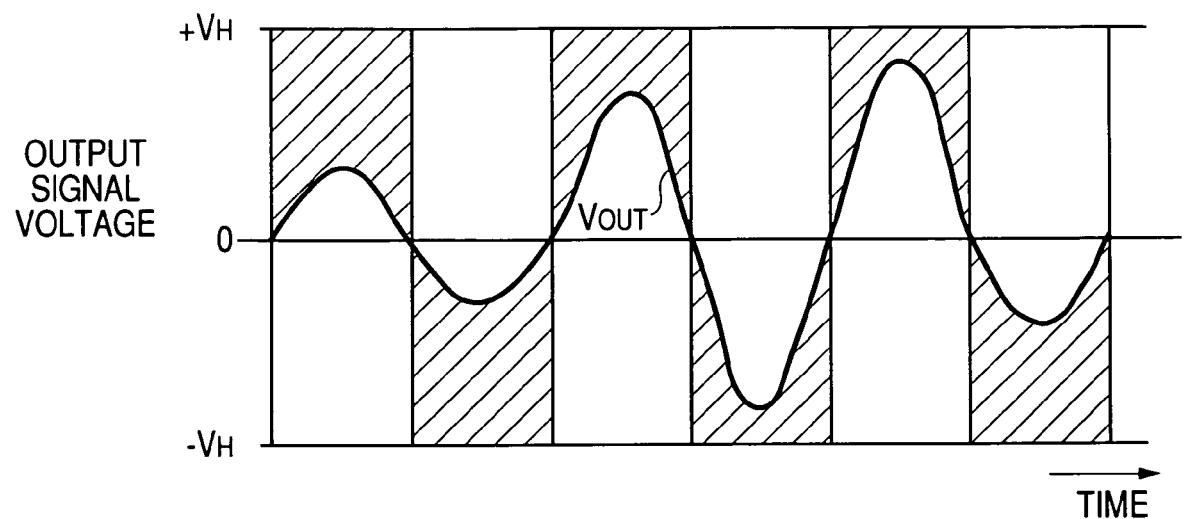
FIG. 1 is a time-domain diagram of a voltage of an output signal from a general power amplifier, and voltages at the positive and negative sides of a high-voltage power supply.

FIG. 1 shows an example of a time-domain variation in the voltage VOUT of an output signal from a general power amplifier. With reference to FIG. 1, in the case where the general power amplifier continues to be supplied with high-voltage electric power ±VH, the general power amplifier causes power losses denoted by the hatched regions.

Figure 2:
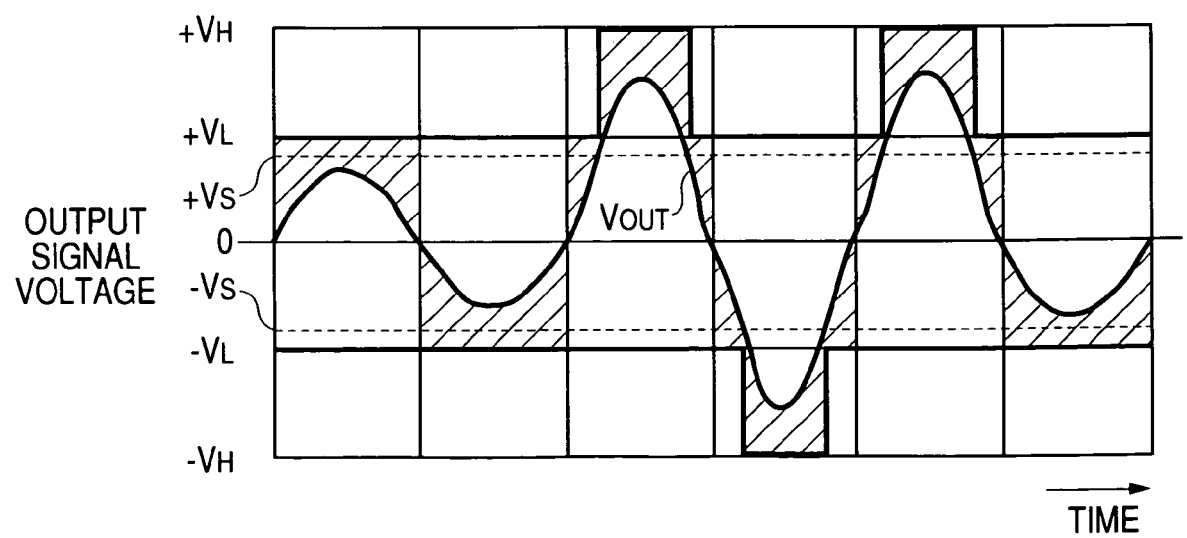
FIG. 2 is a time-domain diagram of an output signal voltage, voltages at the positive and negative sides of a high-voltage power supply, voltages at the positive and negative sides of a low-voltage power supply, and threshold voltages in a prior-art power amplifier circuit.

With reference to FIG. 2, the prior-art circuit uses the low-voltage power supply (±VL) to activate the power amplifier when the voltage VOUT of the output signal of the power amplifier remains in a small-amplitude range defined between threshold voltages +VS and −VS. The prior-art circuit uses the high-voltage power supply (±VH) to activate the power amplifier when the voltage VOUT of the output signal of the power amplifier goes out of the small-amplitude range. The power amplifier causes power losses denoted by the hatched regions in FIG. 2. The caused power losses are smaller than those in FIG. 1, and hence the generation of heat is effectively suppressed. These are advantages provided by the switching between the high-voltage power supply and the low-voltage power supply.

Figure 3:
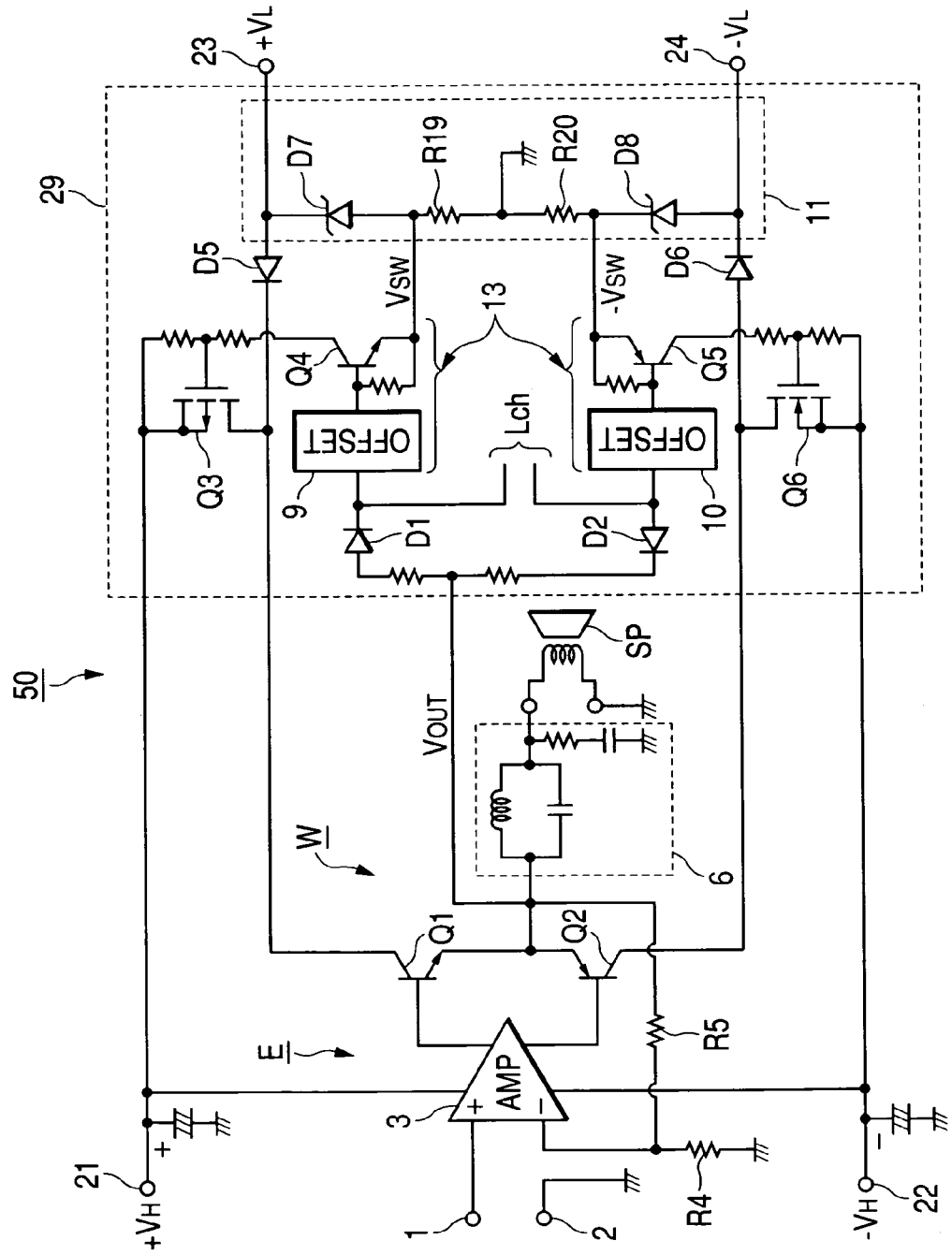
FIG. 3 is a schematic diagram of the prior-art power amplifier circuit.

FIG. 3 shows the details of the prior-art circuit which is denoted by the reference numeral 50. As shown in FIG. 3, the prior-art circuit 50 includes a pair of input terminals 1 and 2 to which an analog input signal or a digital input signal is applied. The prior-art circuit 50 also includes a voltage amplifier E and a power amplifier W. The voltage amplifier E is connected between the input-terminal pair and the power amplifier W. The voltage amplifier E receives the input signal from the input terminals 1 and 2, and amplifies the input signal to get an amplified signal. The voltage amplifier E feeds the amplified signal to the power amplifier W. The voltage amplifier E includes an operational amplifier 3 having a series of an input stage subjected to the input signal, an intermediate stage, and a final stage serving as a driver for the power amplifier W. The power amplifier W forms an output stage composed of power transistors Q1 and Q2. A combination of resistors R4 and R5 is connected with the voltage amplifier E and the power amplifier W. The resistors R4 and R5 determine the gain of the combination of the voltage amplifier E and the power amplifier W.

The prior-art circuit 50 further includes high-speed power switching devices (shortened to high-speed switching devices) Q3 and Q6, a reference-voltage generation circuit 11, and a control circuit 13 which constitute a power-supply changing device 29.

The high-speed switching devices Q3 and Q6 select one from a low-voltage power supply ±VL and a high-voltage power supply ±VH, and use selected one as a power supply for the power transistors Q1 and Q2 (the power amplifier W).

A Zener diode D7 and a resistor R19 connected in series between the positive side +VL of the low-voltage power supply and the ground (0 V) generate a positive-circuit-side reference voltage +VSW. A Zener diode D8 and a resistor R20 connected in series between the negative side −VL of the low-voltage power supply and the ground (0 V) generate a negative-circuit-side reference voltage −VSW. The Zener diodes D7 and D8 and the resistors R19 and R20 constitute the reference-voltage generation circuit 11.

The control circuit 13 receives the voltage VOUT outputted from the power amplifier W. The output voltage VOUT is altered into a signal voltage which the control circuit 13 senses. The control circuit 13 receives the reference voltages ±VSW from the reference-voltage generation circuit 11. The control circuit 13 compares the signal voltage with the reference voltages ±VSW, and selectively turns on and off the high-speed switching devices Q3 and Q6 in accordance with the results of the comparison. When the signal voltage is in the range between the reference voltages ±VSW, the control circuit 13 sets the high-speed switching devices Q3 and Q6 in their off states so that the low-voltage power supply ±VL is selected and used as a power supply for the power transistors Q1 and Q2 (the power amplifier W). On the other hand, when the signal voltage is outside the range between the reference voltages ±VSW, the control circuit 13 sets the high-speed switching devices Q3 and Q6 in their on states so that the high-voltage power supply ±VH is selected and used as a power supply for the power transistors Q1 and Q2 (the power amplifier W).

The prior-art circuit 50 has a pair of power supply terminals 21 and 22, and another pair of power supply terminals 23 and 24. The power supply terminal 21 leads to the positive side +VH of the high-voltage power supply. The power supply terminal 22 leads to the negative side −VH of the high-voltage power supply. The power supply terminal 23 leads to the positive side +VL of the low-voltage power supply. The power supply terminal 24 leads to the negative side −VL of the low-voltage power supply. The high-speed switching device Q3 is connected between the power supply terminal 21 and the collector of the power transistor Q1 in the power amplifier W. The high-speed switching device Q6 is connected between the power supply terminal 22 and the collector of the power transistor Q2 in the power amplifier W. The power supply terminal 23 is connected via a diode D5 with the collector of the power transistor Q1. The power supply terminal 24 is connected via a diode D6 with the collector of the power transistor Q2.

The prior-art circuit 50 in FIG. 50 is designed for a right audio channel. The output side of the power amplifier W is connected via a phase compensation circuit 6 with a right-channel loudspeaker SP. The phase compensation circuit 6 and the right-channel loudspeaker SP constitute a load on the power amplifier W.

The positive-circuit-side reference voltage +VSW is equal to the voltage at the positive side +VL of the low-voltage power supply minus the breakdown voltage VZ of the Zener diode D7 (+VSW=+VL−VZ). The negative-circuit-side reference voltage −VSW is equal to the voltage at the negative side −VL of the low-voltage power supply plus the breakdown voltage VZ of the Zener diode D8 (−VSW=−VL+VZ).

The control circuit 13 has a combination of an offset circuit 9 and a transistor Q4. The offset circuit 9 is connected via a diode D1 with the output side of the power amplifier W. The transistor Q4 acts to control the high-speed switching device Q3. In addition, the control circuit 13 has a combination of an offset circuit 10 and a transistor Q5. The offset circuit 10 is connected via a diode D2 with the output side of the power amplifier W. The transistor Q5 acts to control the high-speed switching device Q6.

The transistor Q4 is in its on state when the output voltage VOUT and the positive-circuit-side reference voltage +VSW (VL−VZ) are in the following relation.

$$VOUT > VL - VZ + VF(D1) + VOFFSET(9) + VBE(Q4) \quad (1)$$

where VF(D1), VOFFSET(9), and VBE(Q4) denote the normal-direction voltage drop across the diode D1, the voltage drop across the offset circuit 9, and the voltage between the base and the emitter of the transistor Q4, respectively. When the transistor Q4 is in its on state, the high-speed switching device Q3 is in its on state so that the positive side +VH of the high-voltage power supply is connected with the power amplifier W. In this case, the collector of the power transistor Q1 is subjected to the voltage at the positive side +VH of the high-voltage power supply.

The transistor Q4 is in its off state when the output voltage VOUT and the positive-circuit-side reference voltage +VSW (VL−VZ) are outside the foregoing relation (1). The off-state transistor Q4 causes the high-speed switching device Q3 to be in its off state. As a result, the diode D5 enables the positive side +VL of the low-voltage power supply to be connected with the power amplifier W instead of the positive side +VH of the high-voltage power supply. In this case, the collector of the power transistor Q1 is subjected to the voltage at the positive side +VL of the low-voltage power supply.

The transistor Q5 is in its on state when the output voltage VOUT and the negative-circuit-side reference voltage −VSW (−VL+VZ) are in the following relation on an absolute-value basis.

$$VOUT > VL - VZ + VF(D2) + VOFFSET(10) + VBE(Q5) \quad (2)$$

where VF(D2), VOFFSET(10), and VBE(Q5) denote the normal-direction voltage drop across the diode D2, the voltage drop across the offset circuit 10, and the voltage between the base and the emitter of the transistor Q5, respectively. When the transistor Q5 is in its on state, the high-speed switching device Q6 is in its on state so that the negative side −VH of the high-voltage power supply is connected with the power amplifier W. In this case, the collector of the power transistor Q2 is subjected to the voltage at the negative side −VH of the high-voltage power supply.

The transistor Q5 is in its off state when the output voltage VOUT and the negative-circuit-side reference voltage −VSW (−VL+VZ) are outside the foregoing relation (2) on an absolute-value basis. The off-state transistor Q5 causes the high-speed switching device Q6 to be in its off state. As a result, the diode D6 enables the negative side −VL of the low-voltage power supply to be connected with the power amplifier W instead of the negative side −VH of the high-voltage power supply. In this case, the collector of the power transistor Q2 is subjected to the voltage at the negative side −VL of the low-voltage power supply.

Typical conditions are as follows. The saturation voltage VCESA between the collector and the emitter of the power transistor Q1 is equal to about 2 V. The normal-direction voltage drop VF(D5) across the diode D5 is equal to about 2 V. The normal-direction voltage drop VF(D1) across the diode D1 is equal to about 0.7 V. The voltage drop VD(9) across the offset circuit 9 is equal to about 7V. The voltage VBE(Q4) between the base and the emitter of the transistor Q4 is equal to about 0.7 V. The sum of the voltages VCESA, VF(D5), VF(D1), VD(9), and VBE(Q4) is equal to about 12.4 V. The breakdown voltage VZ of the Zener diode D7 is set higher than the sum of the voltages VCESA, VF(D5), VF(D1), VD(9), and VBE(Q4). For example, the breakdown voltage VZ of the Zener diode D7 is equal to about 15 V.

As the positive-side voltage +VL of the low-voltage power supply is decreased, the generation of heat is more effectively suppressed when the output voltage VOUT is low in positive-side amplitude.

For home use, the power output from the power amplifier W in the range of about 15 to 20 watts is sufficient. Accordingly, the switching between the low-voltage power supply ±VL and the high-voltage power supply ±VH is set as follows. The low-voltage power supply ±VL is replaced by the high-voltage power supply ±VH when the output voltage VOUT goes beyond a positive-circuit-side or negative-circuit-side threshold value corresponding to, for example, a power output of 20 watts.

The positive-side voltage +VL of the low-voltage power supply is set to, for example, the sum of the peak amplitude of the output voltage VOUT, the saturation voltage VCESA between the collector and the emitter of the power transistor Q1, and the normal-direction voltage drop VF(D5) across the diode D5. In the case where the impedance of the right-channel loudspeaker SP is equal to 8 Ω, the peak amplitude of a sinusoidal wave outputted from the power amplifier W at a power of 20 watts is equal to about 18 V. In this case, the positive-side voltage +VL of the low-voltage power supply is set to about 22 V (18 V+2 V+2 V). As previously indicated, the reference voltage +VSW is equal to the positive-side voltage +VL of the low-voltage power supply minus the breakdown voltage VZ of the Zener diode D7 (+VSW=+VL−VZ). Thus, the reference voltage +VSW is equal to about 7 V (22 V−15 V).

In the case where the impedance of the right-channel loudspeaker SP is equal to 4 Ω, the peak amplitude of a sinusoidal wave outputted from the power amplifier W at a power of 20 watts is equal to about 12.6 V. In this case, the positive-side voltage +VL of the low-voltage power supply is set to about 16.6 V (12.6 V+2 V+2 V). Thus, the reference voltage +VSW is equal to about 1.6 V (16.6 V−15 V).

A fluctuation in an AC line voltage and the regulation of a transformer in a power supply circuit cause a drop in the positive-side voltage +VL of the low-voltage power supply. When the positive-side voltage +VL of the low-voltage power supply is lower than 16.6 V due to the foregoing factors or when the impedance of the right-channel loudspeaker SP is equal to 2 Ω, there is a possibility that the reference voltage +VSW to be set will be lower than 0 V. However, since the reference voltage +VSW is generated by the Zener diode D7 and the resistor R19 connected in series between the positive side +VL of the low-voltage power supply and the ground (0 V), it is difficult to set the reference voltage +VSW lower than 0 V. This possible state means that the power-supply changing circuit 29 can not operate normally, and the low-voltage power supply +VL can not be replaced by the high-voltage power supply +VH.

Similar circumstances are present in the negative circuit side relating to the reference voltage −VSW.

First Embodiment

Figure 4:
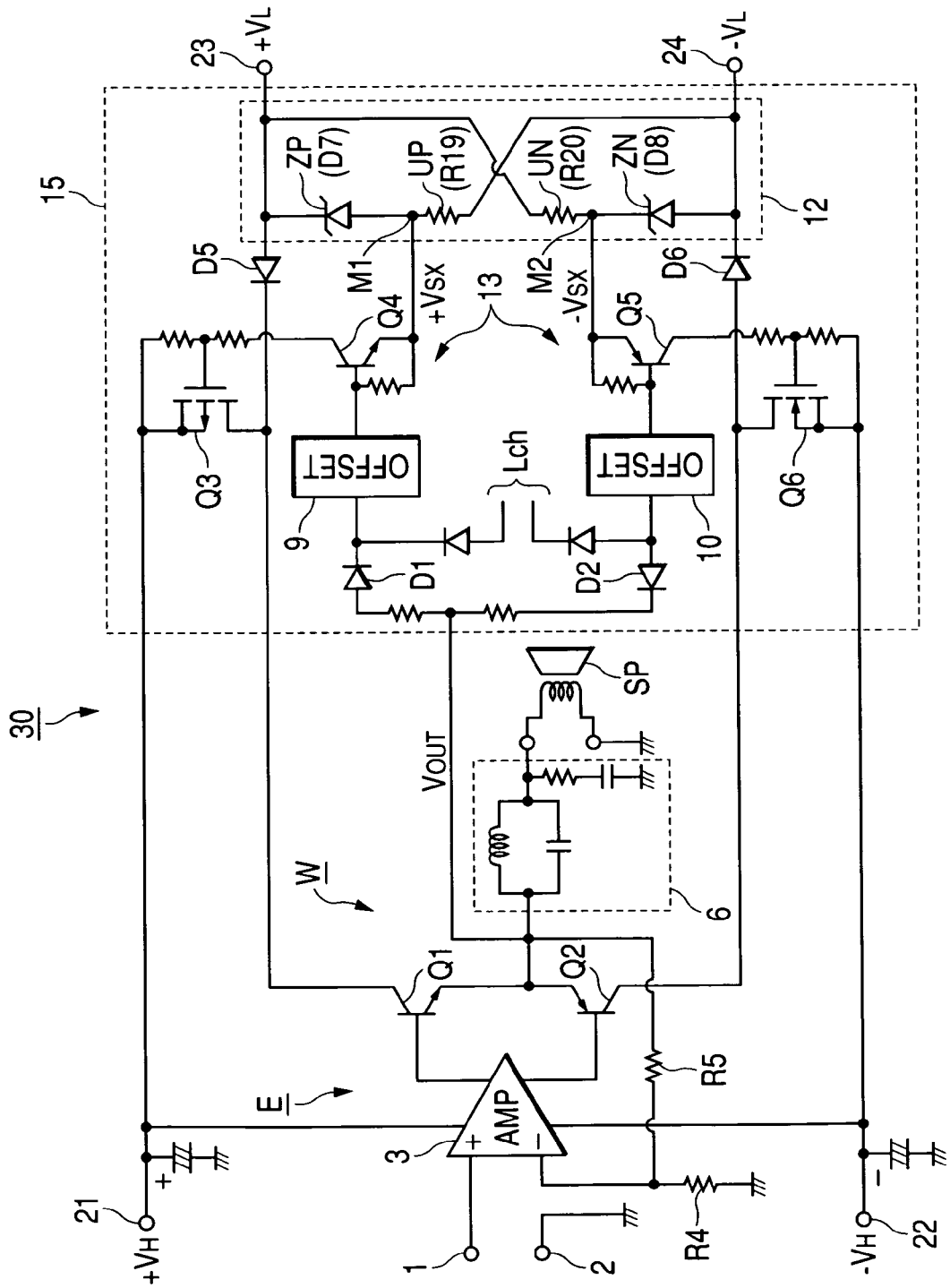
FIG. 4 is a schematic diagram of a power amplifier circuit according to a first embodiment of this invention.

FIG. 4 shows a power amplifier circuit 30 according to a first embodiment of this invention. The power amplifier circuit 30 is designed for a right audio channel.

As shown in FIG. 4, the power amplifier circuit 30 includes a pair of input terminals 1 and 2 to which an analog input signal or a digital input signal is applied. The power amplifier circuit 30 also includes a voltage amplifier E and a power amplifier W. The voltage amplifier E is connected between the input-terminal pair and the power amplifier W. The voltage amplifier E receives the input signal from the input terminals 1 and 2, and amplifies the input signal to get a first amplified signal. The voltage amplifier E feeds the first amplified signal to the power amplifier W. The power amplifier W enlarges the first amplified signal to get a second amplified signal. The power amplifier W feeds the second amplified signal to a right-channel loudspeaker SP via a phase compensation circuit 6. The phase compensation circuit 6 and the right-channel loudspeaker SP constitute a load on the power amplifier W.

The voltage amplifier E includes an operational amplifier 3 having a series of an input stage subjected to the input signal, an intermediate stage, and a final stage serving as a driver for the power amplifier W. The power amplifier W forms an output stage composed of an NPN power transistor Q1 and a PNP power transistor Q2. A combination of resistors R4 and R5 is connected with the voltage amplifier E and the power amplifier W. The resistors R4 and R5 determine the gain of the combination of the voltage amplifier E and the power amplifier W.

The base of the power transistor Q1 and the base of the power transistor Q2 are connected with the output side of the voltage amplifier E. The emitters of the power transistors Q1 and Q2 are connected in common. The junction between the emitters of the power transistors Q1 and Q2 forms the output side (the output terminal) of the power amplifier W. The output side of the power amplifier W leads to the right-channel loudspeaker SP via the phase compensation circuit 6.

The power amplifier circuit 30 further includes high-speed power switching devices (shortened to high-speed switching devices) Q3 and Q6, a reference-voltage generation circuit 12, and a control circuit 13 which constitute a power-supply changing device 15.

The high-speed switching devices Q3 and Q6 use, for example, MOSFETs. The high-speed switching devices Q3 and Q6 select one from a low-voltage power supply ±VL and a high-voltage power supply ±VH, and use selected one as a power supply for the power transistors Q1 and Q2 (the power amplifier W).

The reference-voltage generation circuit 12 produces a positive-circuit-side reference voltage +VSX and a negative-circuit-side reference voltage −VSX from the positive-side voltage +VL and the negative-side voltage −VL of the low-voltage power supply.

The control circuit 13 receives the voltage VOUT outputted from the power amplifier W. The output voltage VOUT is altered into a signal voltage which the control circuit 13 senses. The control circuit 13 receives the reference voltages ±VSX from the reference-voltage generation circuit 12. The control circuit 13 compares the signal voltage with the reference voltages ±VSX, and selectively turns on and off the high-speed switching devices Q3 and Q6 in accordance with the results of the comparison. When the signal voltage is in the range between the reference voltages ±VSX, the control circuit 13 sets the high-speed switching devices Q3 and Q6 in their off states so that the low-voltage power supply ±VL is selected and used as a power supply for the power transistors Q1 and Q2 (the power amplifier W). On the other hand, when the signal voltage is outside the range between the reference voltages ±VSX, the control circuit 13 sets the high-speed switching devices Q3 and Q6 in their on states so that the high-voltage power supply ±VH is selected and used as a power supply for the power transistors Q1 and Q2 (the power amplifier W).

The power amplifier circuit 30 has a pair of power supply terminals 21 and 22, and another pair of power supply terminals 23 and 24. The power supply terminal 21 leads to the positive side +VH of the high-voltage power supply. The power supply terminal 22 leads to the negative side −VH of the high-voltage power supply. The power supply terminal 23 leads to the positive side +VL of the low-voltage power supply. The power supply terminal 24 leads to the negative side −VL of the low-voltage power supply. The high-speed switching device Q3 is connected between the power supply terminal 21 and the collector of the power transistor Q1 in the power amplifier W. The high-speed switching device Q6 is connected between the power supply terminal 22 and the collector of the power transistor Q2 in the power amplifier W. The power supply terminal 23 is connected via a diode D5 with the collector of the power transistor Q1. The power supply terminal 24 is connected via a diode D6 with the collector of the power transistor Q2.

The voltage amplifier E is connected with the power supply terminals 21 and 22. The voltage amplifier E is powered by the high-voltage power supply ±VH. The reference-voltage generation circuit 12 is connected between the power supply terminals 23 and 24. The reference-voltage generation circuit 12 receives the positive-side voltage +VL and the negative-side voltage −VL of the low-voltage power supply.

The reference-voltage generation circuit 12 includes a voltage regulating device ZP and a current setting device UP which are connected in series between the power supply terminals 23 and 24, that is, between the positive side +VL and the negative side −VL of the low-voltage power supply. The voltage regulating device ZP and the current setting device UP compose a voltage regulating circuit for generating a regulated voltage used as the positive-circuit-side reference voltage +VSX. Specifically, at the junction M1 between the voltage regulating device ZP and the current setting device UP, the positive-circuit-side reference voltage +VSX is developed. The voltage regulating device ZP includes, for example, a Zener diode D7. The current setting device UP includes, for example, a resistor R19.

Also, the reference-voltage generation circuit 12 includes a voltage regulating device ZN and a current setting device UN which are connected in series between the power supply terminals 23 and 24, that is, between the positive side +VL and the negative side −VL of the low-voltage power supply. The voltage regulating device ZN and the current setting device UN compose a voltage regulating circuit for generating a regulated voltage used as the negative-circuit-side reference voltage −VSX. Specifically, at the junction M2 between the voltage regulating device ZN and the current setting device UN, the negative-circuit-side reference voltage −VSX is developed. The voltage regulating device ZN includes, for example, a Zener diode D8. The current setting device UN includes, for example, a resistor R20.

The control circuit 13 has a combination of an offset circuit 9 and a transistor Q4. The offset circuit 9 is connected via a diode D1 with the output side of the power amplifier W. The transistor Q4 acts to control the high-speed switching device Q3. In addition, the control circuit 13 has a combination of an offset circuit 10 and a transistor Q5. The offset circuit 10 is connected via a diode D2 with the output side of the power amplifier W. The transistor Q5 acts to control the high-speed switching device Q6.

The positive-circuit-side reference voltage +VSX is equal to the voltage at the positive side +VL of the low-voltage power supply minus the breakdown voltage VZ of the Zener diode D7 (+VSX=+VL−VZ). The negative-circuit-side reference voltage −VSX is equal to the voltage at the negative side −VL of the low-voltage power supply plus the breakdown voltage VZ of the Zener diode D8 (−VSX=−VL+VZ).

The transistor Q4 is in its on state when the output voltage VOUT and the positive-circuit-side reference voltage +VSX (VL−VZ) are in the following relation.

$$VOUT > VL - VZ + VF(D1) + VOFFSET(9) + VBE(Q4) \quad (3)$$

where VF(D1), VOFFSET(9), and VBE(Q4) denote the normal-direction voltage drop across the diode D1, the voltage drop across the offset circuit 9, and the voltage between the base and the emitter of the transistor Q4, respectively. When the transistor Q4 is in its on state, the high-speed switching device Q3 is in its on state so that the positive side +VH of the high-voltage power supply is connected with the power amplifier W. In this case, the collector of the power transistor Q1 is subjected to the voltage at the positive side +VH of the high-voltage power supply.

The transistor Q4 is in its off state when the output voltage VOUT and the positive-circuit-side reference voltage +VSX (VL−VZ) are outside the foregoing relation (3). The off-state transistor Q4 causes the high-speed switching device Q3 to be in its off state. As a result, the diode d5 enables the positive side +VL of the low-voltage power supply to be connected with the power amplifier W instead of the positive side +VH of the high-voltage power supply. In this case, the collector of the power transistor Q1 is subjected to the voltage at the positive side +VL of the low-voltage power supply.

The transistor Q5 is in its on state when the output voltage VOUT and the negative-circuit-side reference voltage −VSX (−VL+VZ) are in the following relation on an absolute-value basis.

$$VOUT > VL - VZ + VF(D2) + VOFFSET(10) + VBE(Q5) \quad (4)$$

where VF(D2), VOFFSET(10), and VBE(Q5) denote the normal-direction voltage drop across the diode D2, the voltage drop across the offset circuit 10, and the voltage between the base and the emitter of the transistor Q5, respectively. When the transistor Q5 is in its on state, the high-speed switching device Q6 is in its on state so that the negative side −VH of the high-voltage power supply is connected with the power amplifier W. In this case, the collector of the power transistor Q2 is subjected to the voltage at the negative side −VH of the high-voltage power supply.

The transistor Q5 is in its off state when the output voltage VOUT and the negative-circuit-side reference voltage −VSX (−VL+VZ) are outside the foregoing relation (4) on an absolute-value basis. The off-state transistor Q5 causes the high-speed switching device Q6 to be in its off state. As a result, the diode D6 enables the negative side −VL of the low-voltage power supply to be connected with the power amplifier W instead of the negative side −VH of the high-voltage power supply. In this case, the collector of the power transistor Q2 is subjected to the voltage at the negative side −VL of the low-voltage power supply.

The reference voltage +VSX occurs at the junction M1 between the Zener diode D7 and the resistor R19 which are connected in series between the power supply terminals 23 and 24, that is, between the positive side +VL and the negative side −VL of the low-voltage power supply. Therefore, it is possible to set the reference voltage +VSX lower than 0 V. Thus, even in the case where the Zener diode D7 has a breakdown voltage of 15 V, the reference voltage +VSX can be properly set and the positive-side voltage +VL of the low-voltage power supply can be relatively low without spoiling the switching between the high-voltage power supply ±VH and the low-voltage power supply ±VL. Similarly, the reference voltage −VSX can be properly set and the absolute value of the negative-side voltage −VL of the low-voltage power supply can be relatively small without spoiling the switching between the high-voltage power supply ±VH and the low-voltage power supply ±VL.

Figure 5:
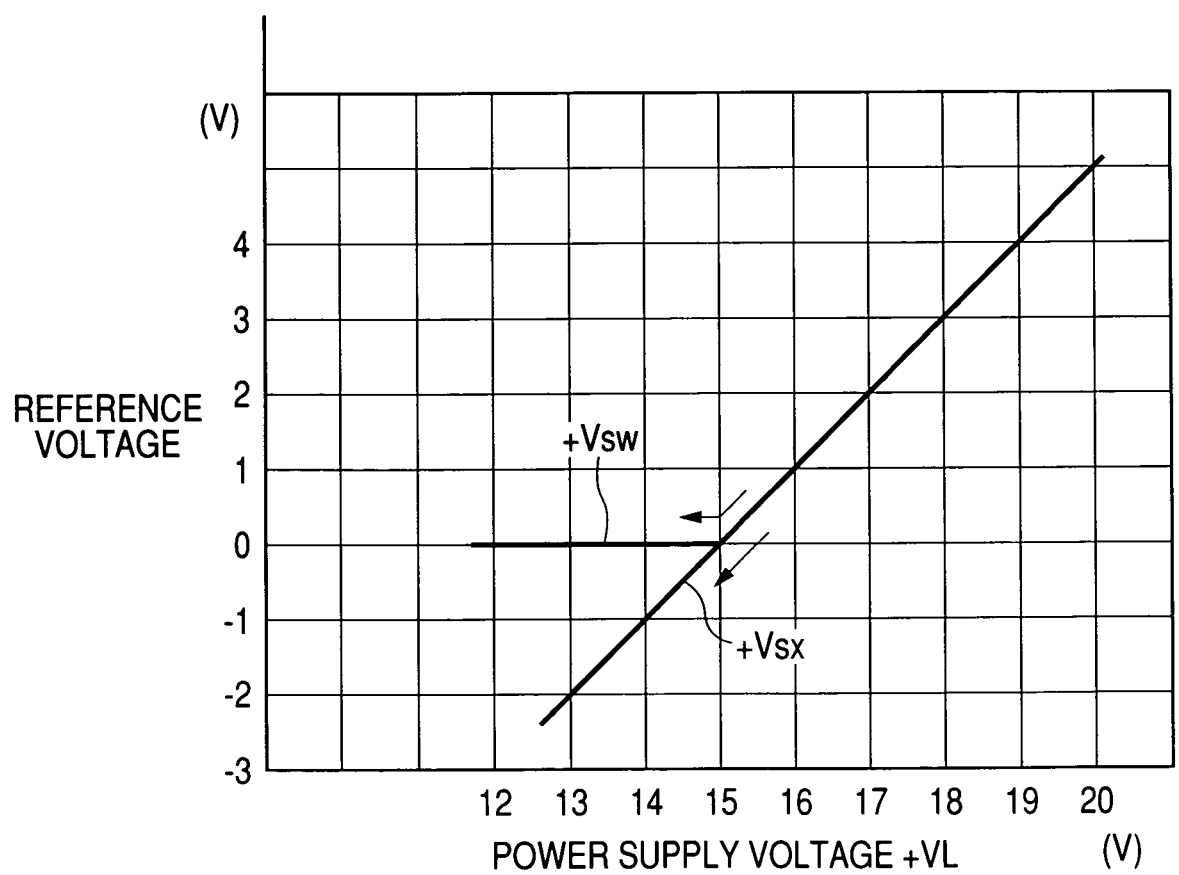
FIG. 5 is a diagram of the relation between a reference voltage and a voltage at the positive side of a low-voltage power supply in the power amplifier circuit of FIG. 4, and the corresponding relation in the prior-art amplifier circuit.

With reference to FIG. 5, the reference voltage +VSX drops from 5 V to −2V as the positive-side voltage +VL decreases from 20 V to 13 V. Thus, it is possible to set the reference voltage +VSX lower than 0 V. On the other hand, the reference voltage +VSW in the prior-art circuit of FIG. 3 drops from 5 V to 0 V and then remains at 0 V as the positive-side voltage +VL decreases from 20 V to 13 V. Thus, in the prior-art circuit of FIG. 3, it is difficult to set the reference voltage +VSW lower than 0 V.

When the impedance of the right-channel loudspeaker SP is equal to 4 Ω or 2 Ω, the peak amplitude of a sinusoidal wave outputted from the power amplifier W at a power of 20 watts is equal to about 10 V. A fluctuation in an AC line voltage and the regulation of a transformer in a power supply circuit cause drops in the absolute values of the positive-side voltage +VL and the negative-side voltage −VL of the low-voltage power supply.

Even in the case the impedance of the right-channel loudspeaker SP is equal to 4 Ω or 2 Ω and there occur drops in the absolute values of the positive-side voltage +VL and the negative-side voltage −VL of the low-voltage power supply, the reference voltages ±VSX can be proper so that the switching between the high-voltage power supply ±VH and the low-voltage power supply ±VL can remain normal. The proper value of the reference voltage +VSX is separate from the original value in the negative-going direction. The proper value of the reference voltage −VSX is separate from the original value in the positive-going direction.

Figure 6:
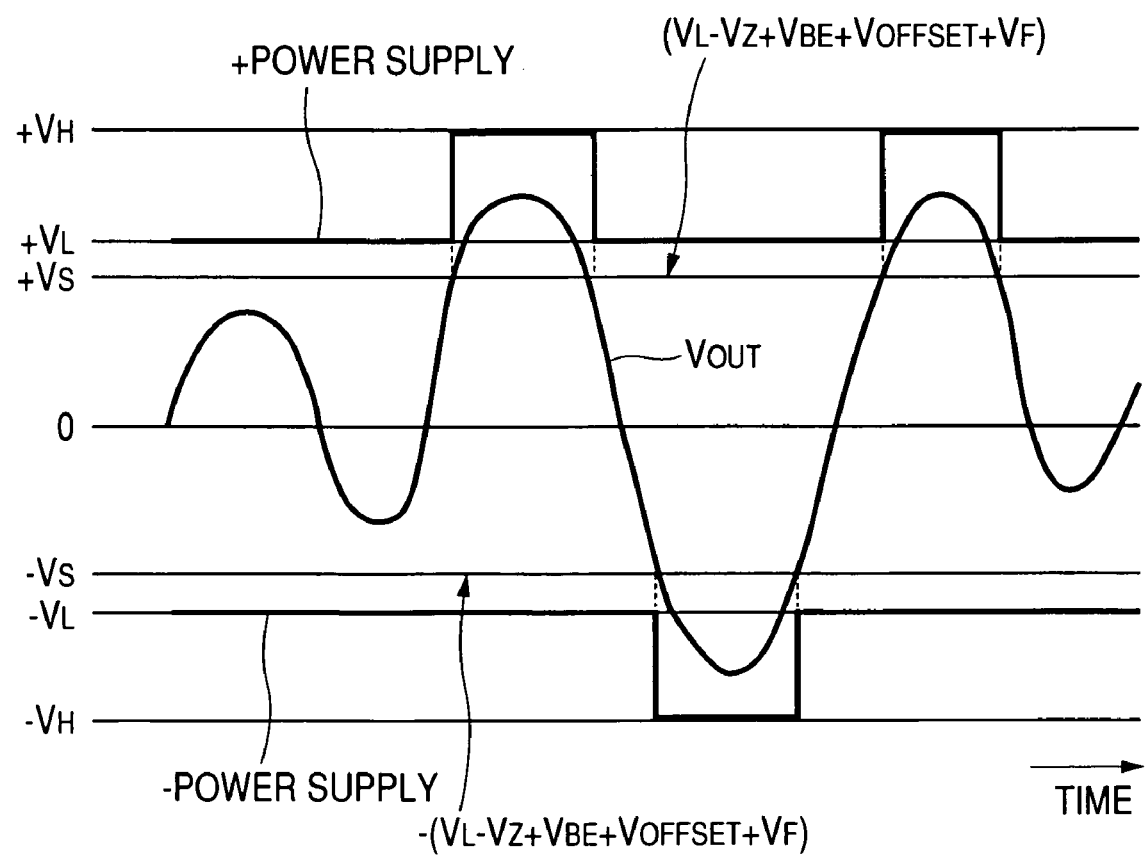
FIG. 6 is a time-domain diagram of an output signal voltage, voltages at the positive and negative sides of a high-voltage power supply, voltages at the positive and negative sides of a low-voltage power supply, and threshold voltages in the power amplifier circuit of FIG. 4.

With reference to FIG. 6, a positive-circuit side threshold voltage +VS is given as follows.

$$+VS = VL - VZ + VBE + VOFFSET + VF \quad (5)$$

where VF, VOFFSET, and VBE denote the normal-direction voltage drop across the diode D1, the voltage drop across the offset circuit 9, and the voltage between the base and the emitter of the transistor Q4, respectively. The positive-circuit-side reference voltage +VSX is equal to "VL−VZ". When the output voltage VOUT is higher than the positive-circuit-side threshold voltage +VS, that is, when VOUT−(VBE+VOFFSET+VF)>+VSX, the transistor Q4 and the high-speed switching device Q3 are in their on states so that the positive-side voltage +VH of the high-voltage power supply is applied to the power amplifier W. Otherwise, the transistor Q4 and the high-speed switching device Q3 are in their off states so that the positive-side voltage +VL of the low-voltage power supply is applied to the power amplifier W.

With reference to FIG. 6, a negative-circuit-side threshold voltage −VS is given as follows.

$$-VS = -(VL - VZ + VBE + VOFFSET + VF) \quad (6)$$

where VF, VOFFSET, and VBE denote the normal-direction voltage drop across the diode D2, the voltage drop across the offset circuit 10, and the voltage between the base and the emitter of the transistor Q5, respectively. The negative-circuit-side reference voltage −VSX is equal to "−VL+VZ". When the output voltage VOUT is lower than the negative-circuit-side threshold voltage −VS, that is, when VOUT+(VBE+VOFFSET+VF)<−VSX, the transistor Q5 and the high-speed switching device Q6 are in their on states so that the negative-side voltage −VH of the high-voltage power supply is applied to the power amplifier W. Otherwise, the transistor Q5 and the high-speed switching device Q6 are in their off states so that the negative-side voltage −VL of the low-voltage power supply is applied to the power amplifier W.

As understood from the previous description, the power-supply changing device 15 produces the positive-circuit-side reference voltage +VSX and the negative-circuit-side reference voltage −VSX. In addition, the power-supply changing device 15 generates the positive-circuit-side threshold voltage +VS from the positive-circuit-side reference voltage +VSX, and generates the negative-circuit-side threshold voltage −VS from the negative-circuit-side reference voltage −VSX. The power-supply changing device 15 compares the output voltage VOUT with the positive-circuit-side threshold voltage +VS and the negative-circuit-side threshold voltage −VS. When the output voltage VOUT is in the range between the positive-circuit-side threshold voltage +VS and the negative-circuit-side threshold voltage −VS, the power-supply changing device 15 selects and uses the low-voltage power supply ±VL as a power supply for activating the power amplifier W. On the other hand, when the output voltage VOUT is outside the foregoing range, the power-supply changing device 15 selects and uses the high-voltage power supply ±VH as a power supply for activating the power amplifier W.

Second Embodiment

Figure 7:
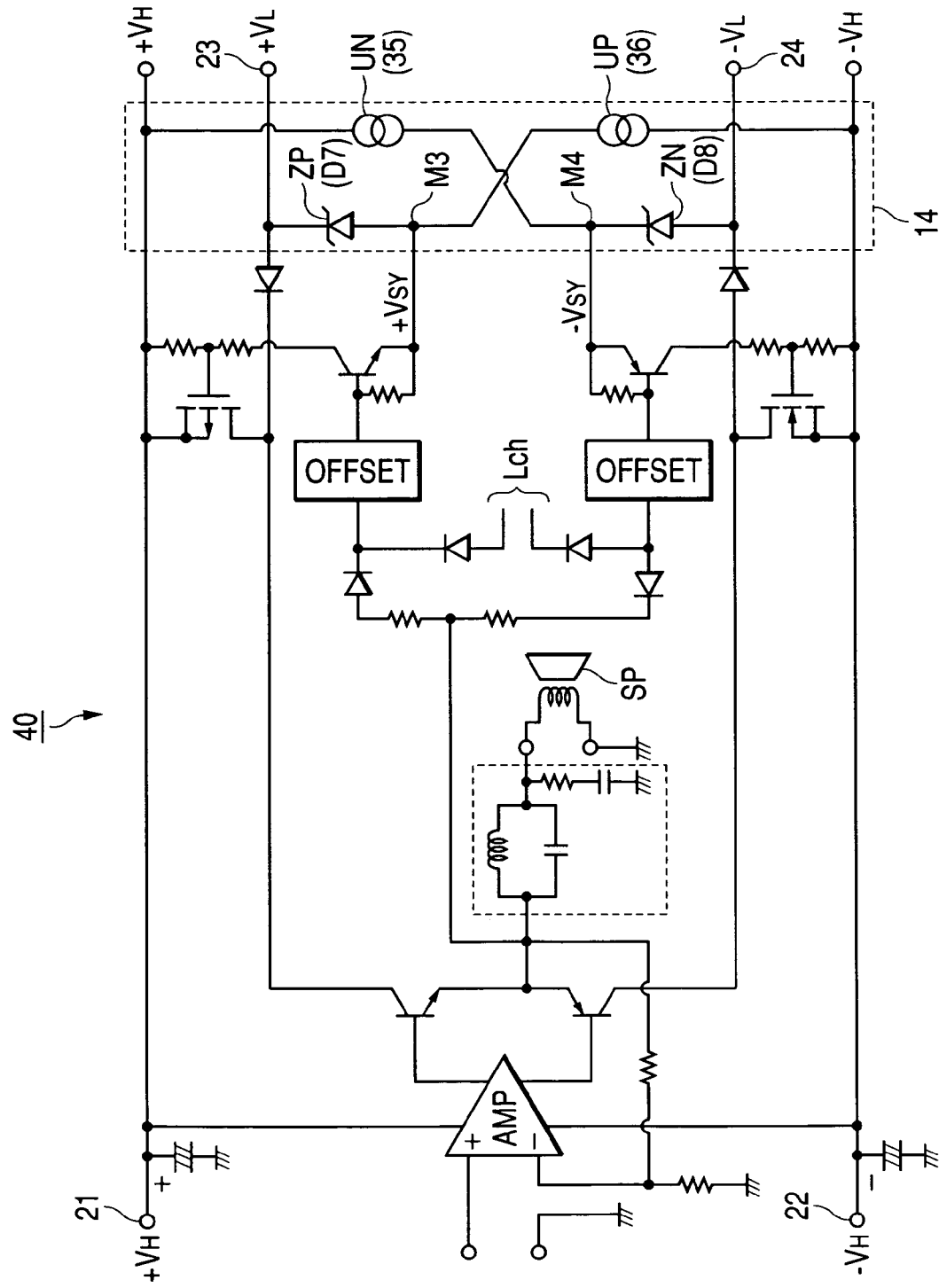
FIG. 7 is a schematic diagram of a power amplifier circuit according to a second embodiment of this invention.

FIG. 7 shows a power amplifier circuit 40 according to a second embodiment of this invention. The power amplifier circuit 40 is similar to the power amplifier circuit 30 (see FIG. 4) except for design changes mentioned hereafter.

As shown in FIG. 7, the power amplifier circuit 40 includes a reference-voltage generation circuit 14 which replaces the reference-voltage generation circuit 12 (see FIG. 4).

The reference-voltage generation circuit 14 produces a positive-circuit-side reference voltage +VSY and a negative-circuit-side reference voltage −VSY from the voltages of the high-voltage power supply ±VH and the low-voltage power supply ±VL. The reference voltages ±VSY are used instead of the reference voltages ±VSX (see FIG. 4).

The reference-voltage generation circuit 14 includes a voltage regulating device ZP and a current setting device UP which are connected in series between the power supply terminals 22 and 23, that is, between the negative side −VH of the high-voltage power supply and the positive side +VL of the low-voltage power supply. The voltage regulating device ZP and the current setting device UP compose a voltage regulating circuit for generating a regulated voltage used as the positive-circuit-side reference voltage +VSY. Specifically, at the junction M3 between the voltage regulating device ZP and the current setting device UP, the positive-circuit-side reference voltage +VSY is developed. The voltage regulating device ZP includes, for example, a Zener diode D7. The current setting device UP includes, for example, a current regulative diode (CRD) 36.

Also, the reference-voltage generation circuit 14 includes a voltage regulating device ZN and a current setting device UN which are connected in series between the power supply terminals 21 and 24, that is, between the positive side +VH of the high-voltage power supply and the negative side −VL of the low-voltage power supply. The voltage regulating device ZN and the current setting device UN compose a voltage regulating circuit for generating a regulated voltage used as the negative-circuit-side reference voltage −VSY. Specifically, at the junction M4 between the voltage regulating device ZN and the current setting device UN, the negative-circuit-side reference voltage −VSY is developed. The voltage regulating device ZN includes, for example, a Zener diode D8. The current setting device UN includes, for example, a current regulative diode (CRD) 35.

Third Embodiment

Figure 8:
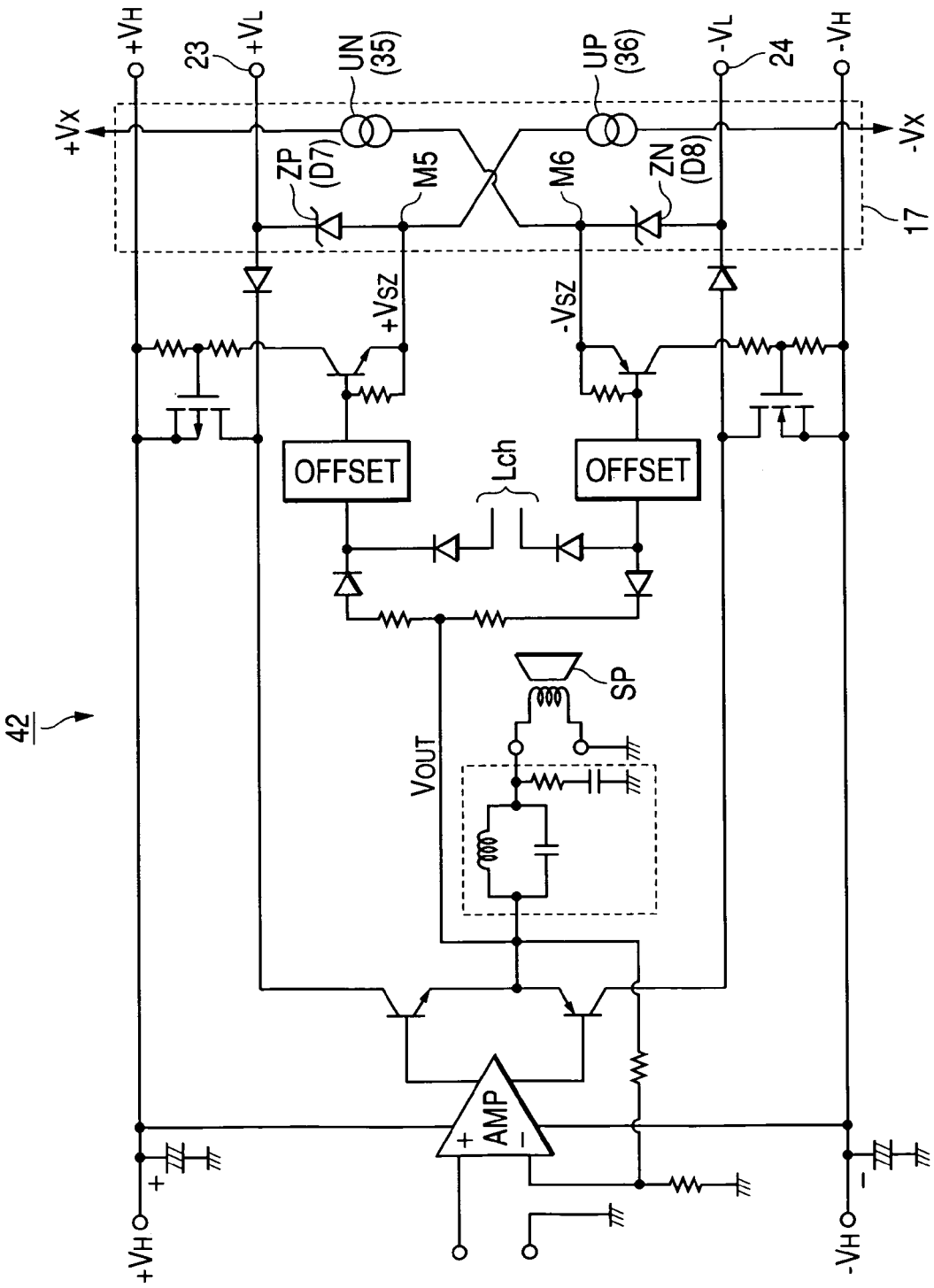
FIG. 8 is a schematic diagram of a power amplifier circuit according to a third embodiment of this invention.

FIG. 8 shows a power amplifier circuit 42 according to a third embodiment of this invention. The power amplifier circuit 42 is similar to the power amplifier circuit 30 (see FIG. 4) except for design changes mentioned hereafter.

As shown in FIG. 8, the power amplifier circuit 42 includes a reference-voltage generation circuit 17 which replaces the reference-voltage generation circuit 12 (see FIG. 4).

The reference-voltage generation circuit 17 produces a positive-circuit-side reference voltage +VSZ and a negative-circuit-side reference voltage −VSZ from the voltages of the low-voltage power supply ±VL and a third power supply ±VX. The reference voltages ±VSZ are used instead of the reference voltages ±VSX (see FIG. 4).

The reference-voltage generation circuit 17 includes a voltage regulating device ZP and a current setting device UP which are connected in series between the positive side +VL of the low-voltage power supply and the negative side −VX of the third power supply. The voltage regulating device ZP and the current setting device UP compose a voltage regulating circuit for generating a regulated voltage used as the positive-circuit-side reference voltage +VSZ. Specifically, at the junction M5 between the voltage regulating device ZP and the current setting device UP, the positive-circuit-side reference voltage +VSZ is developed. The voltage regulating device ZP includes, for example, a Zener diode D7. The current setting device UP includes, for example, a current regulative diode (CRD) 36.

Also, the reference-voltage generation circuit 17 includes a voltage regulating device ZN and a current setting device UN which are connected in series between the positive side +VX of the third power supply and the negative side −VL of the low-voltage power supply. The voltage regulating device ZN and the current setting device UN compose a voltage regulating circuit for generating a regulated voltage used as the negative-circuit-side reference voltage −VSZ. Specifically, at the junction M6 between the voltage regulating device ZN and the current setting device UN, the negative-circuit-side reference voltage −VSZ is developed. The voltage regulating device ZN includes, for example, a Zener diode D8. The current setting device UN includes, for example, a current regulative diode (CRD) 35.

The absolute value of the voltage at the positive side +VX of the third power supply is equal to or different from that of the voltage at the negative side −VX thereof.

Fourth Embodiment

A fourth embodiment of this invention is similar to the first embodiment thereof except for design changes mentioned hereafter. The fourth embodiment of this invention includes a reference-voltage generation circuit 18 shown in FIG. 9. The reference-voltage generation circuit 18 replaces the reference-voltage generation circuit 12 (see FIG. 4).

Figure 9:
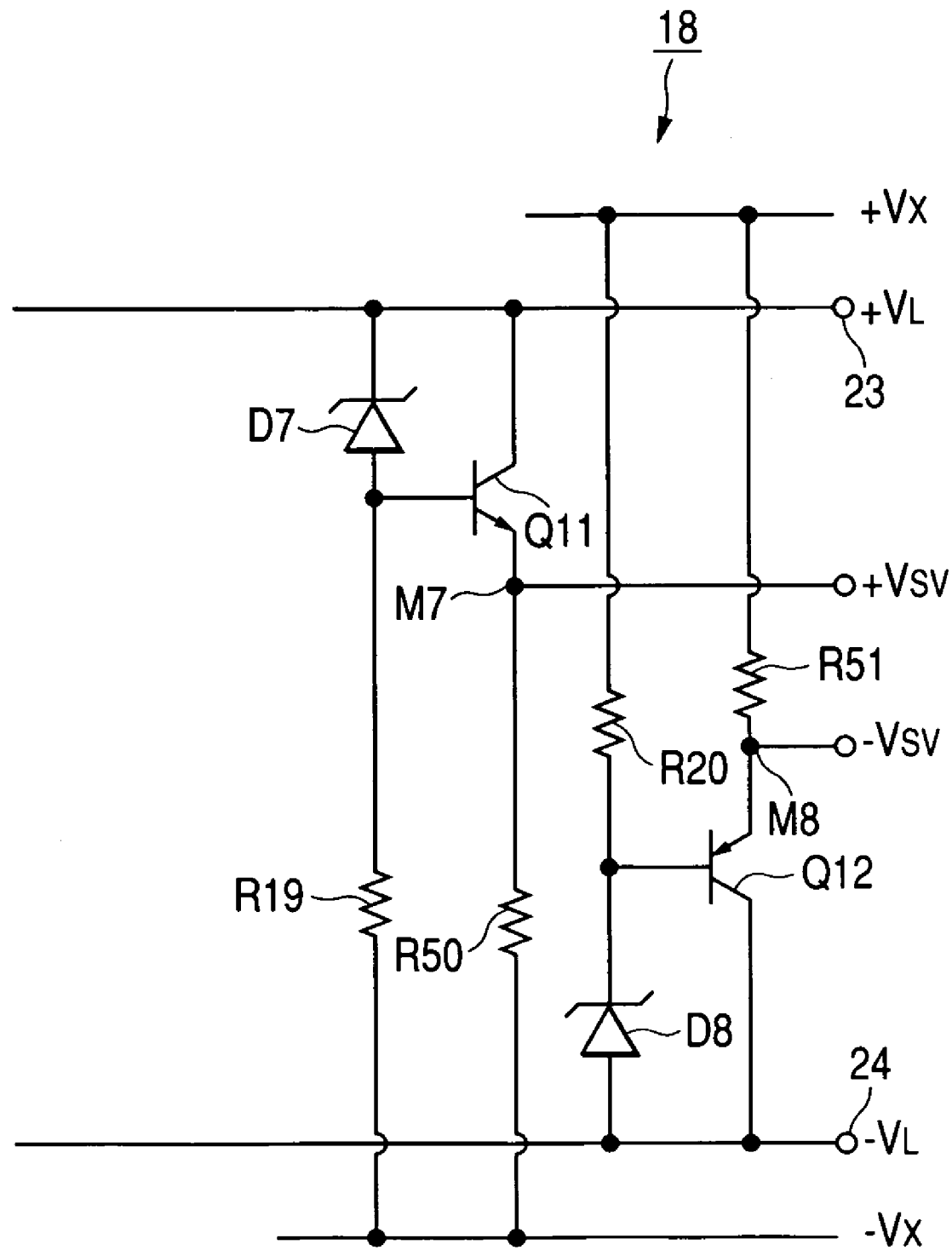
FIG. 9 is a schematic diagram of a reference-voltage generation circuit in a power amplifier circuit according to a fourth embodiment of this invention.

With reference to FIG. 9, the reference-voltage generation circuit 18 produces a positive-circuit-side reference voltage +VSV and a negative-circuit-side reference voltage −VSV from the voltages of the low-voltage power supply ±VL and a third power supply ±VX. The reference voltages ±VSV are used instead of the reference voltages ±VSX (see FIG. 4).

The reference-voltage generation circuit 18 includes a Zener diode D7 and a resistor R19 which are connected in series between the positive side +VL of the low-voltage power supply and the negative side −VX of the third power supply. The resistor R19 may be replaced by a current regulative diode (CRD). The reference-voltage generation circuit 18 further includes an NPN transistor Q11 and a resistor R50. The base of the transistor Q11 is connected to the junction between the Zener diode D7 and the resistor R19. The collector of the transistor Q11 is connected to the positive side +VL of the low-voltage power supply. The emitter of the transistor Q11 is connected via the resistor R50 to the negative side −VX of the third power supply. The Zener diode D7, the transistor Q11, and the resistors R19 and R50 compose a voltage regulating circuit for generating a regulated voltage used as the positive-circuit-side reference voltage +VSV. Specifically, at the junction M7 between the transistor Q11 and the resistor R50, the positive-circuit-side reference voltage +VSV is developed.

Also, the reference-voltage generation circuit 18 includes a Zener diode D8 and a resistor R20 which are connected in series between the negative side −VL of the low-voltage power supply and the positive side +VX of the third power supply. The resistor R20 may be replaced by a current regulative diode (CRD). The reference-voltage generation circuit 18 further includes a PNP transistor Q12 and a resistor R51. The base of the transistor Q12 is connected to the junction between the Zener diode D8 and the resistor R20. The collector of the transistor Q12 is connected to the negative side −VL of the low-voltage power supply. The emitter of the transistor Q12 is connected via the resistor R51 to the positive side +VX of the third power supply. The Zener diode D8, the transistor Q12, and the resistors R20 and R51 compose a voltage regulating circuit for generating a regulated voltage used as the negative-circuit-side reference voltage −VSV. Specifically, at the junction M8 between the transistor Q12 and the resistor R51, the negative-circuit-side reference voltage −VSV is developed.

The absolute value of the voltage at the positive side +VX of the third power supply is equal to or different from that of the voltage at the negative side −VX thereof.

Advantages Provided by the Invention

The power-supply changing device selects one from the high-voltage power supply ±VH and the low-voltage power supply ±VL in response to the output voltage VOUT, and uses selected one as a power supply for the power transistors Q1 and Q2 in the power amplifier W. Therefore, it is possible to reduce power losses when the output signal from the power amplifier W has a small amplitude. The reduction of power losses suppresses the generation of heat.

The absolute value of the voltages at the positive side +VL and the negative side −VL of the low-voltage power supply can be smaller without spoiling the switching between the high-voltage power supply ±VH and the low-voltage power supply ±VL. Even when the impedance of the right-channel loudspeaker SP is equal to 4 Ω or less, the switching between the high-voltage power supply ±VH and the low-voltage power supply ±VL can remain normal.

What is claimed is:
1. A power amplifier circuit comprising:
a power amplifier;
a switching device for selectively connecting either a low-voltage power supply or a high-voltage power supply to the power amplifier;

means for generating a signal voltage in response to a voltage outputted from the power amplifier;

a reference-voltage generation circuit for generating a positive-circuit-side reference voltage and a negative-circuit-side reference voltage; and a control circuit for comparing the signal voltage with the positive-circuit-side and negative-circuit-side reference voltages and controlling the switching device in response to results of the comparison so that the low-voltage power supply is connected to the power amplifier when an absolute value of the signal voltage is smaller than absolute values of the positive-circuit-side and negative-circuit-side reference voltages, and that the high-voltage power supply is connected to the power amplifier when the absolute value of the signal voltage is greater than the absolute values of the positive-circuit-side and negative-circuit side reference voltages;

wherein the reference-voltage generation circuit comprises a first voltage regulating circuit connected between a positive side of the low-voltage power supply and a first circuit point subjected to a negative potential for generating the positive-circuit-side reference voltage, and a second voltage regulating circuit connected between a negative side of the low-voltage power supply and a second circuit point subjected to a positive potential for generating the negative-circuit-side reference voltage.

2. A power amplifier circuit as recited in claim 1, wherein the negative potential is equal to a voltage at the negative side of the low-voltage power supply, and the positive potential is equal to a voltage at the positive side of the low-voltage power supply.

3. A power amplifier circuit as recited in claim 1, wherein the negative potential is equal to a voltage at a negative side of the high-voltage power supply, and the positive potential is equal to a voltage at a positive side of the high-voltage power supply.

4. A power amplifier circuit as recited in claim 1, wherein the negative potential is equal to a voltage at a negative side of a power source, and the positive potential is equal to a voltage at a positive side of the power source.

5. A power amplifier circuit comprising:

a power amplifier;

first means for generating a positive-circuit-side threshold voltage and a negative-circuit-side threshold voltage;

second means for comparing a signal voltage outputted from the power amplifier with the positive-circuit-side and negative-circuit-side threshold voltages generated by the first means; and third means responsive to results of the comparing by the second means for enabling the power amplifier to be activated by a first power supply when the signal voltage is in a range between the positive-circuit-side and negative-circuit-side threshold voltages, and for enabling the power amplifier to be activated by a second power supply when the signal voltage is outside the range between the positive-circuit-side and negative-circuit-side threshold voltages;

wherein a voltage across the first power supply is lower than a voltage across the second power supply; and wherein the first means comprises a first voltage regulating circuit connected between a first circuit point subjected to a first positive potential and a second circuit point subjected to a first negative potential for generating a positive-circuit-side regulated voltage, means for generating the positive-circuit-side threshold voltage from the positive-circuit-side regulated voltage, a second voltage regulating circuit connected between a third circuit point subjected to a second negative potential and a fourth circuit point subjected to a second positive potential for generating a negative-circuit-side regulated voltage, and means for generating the negative-circuit-side threshold voltage from the negative-circuit-side regulated voltage.

6. A power amplifier circuit as recited in claim 5, wherein the first and second positive potentials are equal to a voltage at a positive side of the first power supply, and the first and second negative potentials are equal to a voltage at a negative side of the first power supply.

7. A power amplifier circuit as recited in claim 5, wherein the first positive potential is equal to a voltage at a positive side of the first power supply, and the first negative potential is equal to a voltage at a negative side of the second power supply, and wherein the second positive potential is equal to a voltage at a positive side of the second power supply and the second negative potential is equal to a voltage at a negative side of the first power supply.

8. A power amplifier circuit as recited in claim 5, wherein the first positive potential is equal to a voltage at a positive side of the first power supply, and the first negative potential is equal to a voltage at a negative side of a power source, and wherein the second positive potential is equal to a voltage at a positive side of the power source and the second negative potential is equal to a voltage at a negative side of the first power supply.

* * * * *